(12) United States Patent
Chang et al.

(10) Patent No.: US 9,761,592 B2
(45) Date of Patent: Sep. 12, 2017

(54) STRUCTURE AND FORMATION METHOD OF SEMICONDUCTOR DEVICE WITH EMBEDDED CAPACITOR

(71) Applicant: TAIWAN SEMICONDUCTOR MANUFACTURING CO., LTD, Hsin-Chu (TW)

(72) Inventors: Geng-Shuoh Chang, Taipei (TW); Yung-Tsun Liu, Taipei (TW); Chun-Sheng Wu, Hsinchu (TW); Chun-Li Lin, Hsinchu (TW); Yi-Fang Li, Hemei Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 87 days.

(21) Appl. No.: 14/470,399

(22) Filed: Aug. 27, 2014

(65) Prior Publication Data
US 2016/0064385 A1    Mar. 3, 2016

(51) Int. Cl.
| | | |
|---|---|---|
| H01L 27/108 | (2006.01) | |
| H01L 23/64 | (2006.01) | |
| H01L 23/485 | (2006.01) | |
| H01L 23/522 | (2006.01) | |
| H01L 49/02 | (2006.01) | |

(52) U.S. Cl.
CPC ...... *H01L 27/10855* (2013.01); *H01L 23/485* (2013.01); *H01L 23/5223* (2013.01); *H01L 23/642* (2013.01); *H01L 27/10808* (2013.01); *H01L 27/10852* (2013.01); *H01L 28/90* (2013.01); *H01L 2924/0002* (2013.01)

(58) Field of Classification Search
CPC ...................................... H01L 28/92
See application file for complete search history.

(56) References Cited

U.S. PATENT DOCUMENTS

| | | | | |
|---|---|---|---|---|
| 6,313,005 | B1 * | 11/2001 | Kishida | .................. H01L 28/91 257/E21.013 |
| 6,596,580 | B2 * | 7/2003 | Lian | ........................ H01L 28/75 257/303 |
| 6,720,232 | B1 * | 4/2004 | Tu | ..................... H01L 27/10811 257/296 |
| 2002/0185671 | A1 * | 12/2002 | Kim | .................. H01L 21/76807 257/301 |
| 2003/0077858 | A1 | 4/2003 | Lian et al. | |
| 2005/0191820 | A1 * | 9/2005 | Tu | ..................... H01L 21/32139 438/396 |
| 2008/0217775 | A1 | 9/2008 | Pai et al. | |

\* cited by examiner

*Primary Examiner* — Stephen W Smoot
(74) *Attorney, Agent, or Firm* — Birch, Stewart, Kolasch & Birch, LLP

(57) ABSTRACT

A structure and a formation method of a semiconductor device are provided. The semiconductor device includes a semiconductor substrate and a dielectric layer over the semiconductor substrate. The semiconductor device also includes a contact plug in the dielectric layer, and a recess extending from a surface of the dielectric layer towards the contact plug. The semiconductor device further includes a capacitor element in the recess and electrically connected to the contact plug.

20 Claims, 10 Drawing Sheets

STRUCTURE AND FORMATION METHOD OF SEMICONDUCTOR DEVICE WITH EMBEDDED CAPACITOR

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

In the semiconductor IC industry, manufacturers are currently imbedding dynamic random access memory (DRAM) arrays on the same substrate as CPU cores or other logic devices. This technology is being referred to as embedded DRAM (EDRAM). Embedded DRAM generally can provide micro controller (MCU) and other embedded controllers faster access to larger capacities of on-chip memory at a lower cost.

A semiconductor memory, such as a DRAM or embedded DRAM, mainly consists of a transistor and a capacitor. However, as the feature sizes shrink further and density requirements increase, it is getting more difficult to form the capacitor. It is desirable to have an improved fabrication process for forming an EDRAM device.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
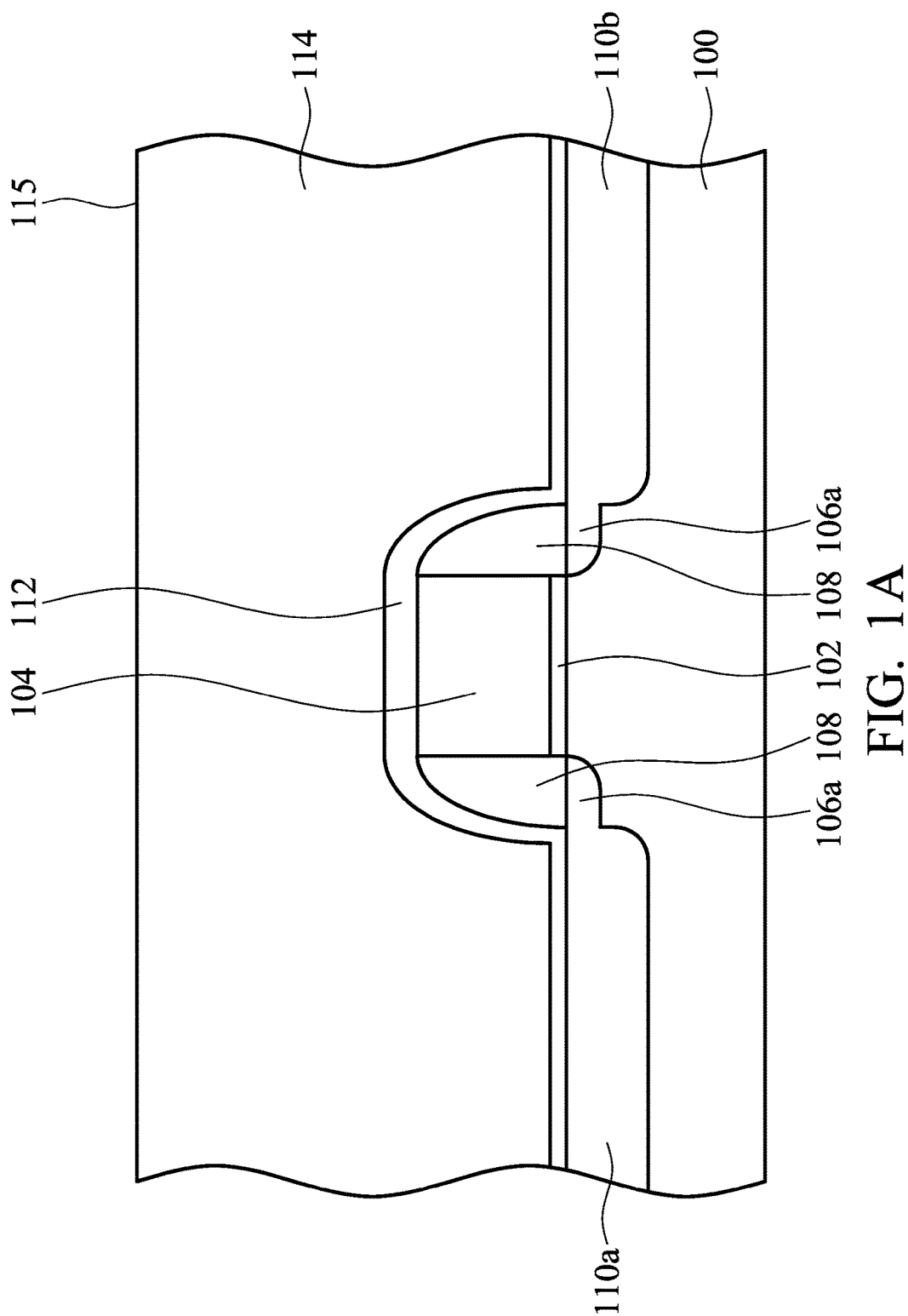
FIGS. 1A-1H are cross-sectional views of various stages of a process for forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of embodiments of the disclosure are described. FIGS. 1A-1H are cross-sectional views of various stages of a process for forming a semiconductor device, in accordance with some embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated by using a separation by implantation of oxygen (SIMOX) process, a wafer bonding process, another applicable method, or a combination thereof.

In some embodiments, isolation features (not shown) are formed in the semiconductor substrate 100 to define and isolate various device elements (not shown) formed in the semiconductor substrate 100. The isolation features include, for example, trench isolation (STI) features or local oxidation of silicon (LOCOS) features.

Examples of the various device elements that may be formed in semiconductor die 100, include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

As shown in FIG. 1A, a gate dielectric material and a gate electrode layer are deposited and patterned to form a gate dielectric layer 102 and a gate electrode 104 over the semiconductor substrate 100, in accordance with some embodiments. In some embodiments, the gate dielectric material and the gate electrode layer are sequentially deposited by using a chemical vapor deposition (CVD) process, an atomic layer deposition (ALD) process, a thermal oxidation process, another applicable process, or a combination thereof.

Afterwards, a patterning process including, for example, photolithography and etching processes is performed to pattern the gate dielectric material and the gate electrode layer. As a result, the gate dielectric layer 102 and the gate electrode 104 are formed. The gate dielectric layer 102 and the gate electrode 104 together form a gate stack. In some embodiments, the gate stack is positioned on an embedded DRAM array region. In some embodiments, the semiconductor substrate 100 further includes other regions such as an input/output (I/O) region (not shown) and a core region (not shown) near the embedded DRAM array region.

In some embodiments, the gate dielectric layer 102 is made of silicon oxide, silicon nitride, silicon oxynitride, dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 102 is a dummy gate dielectric layer which will be removed in a subsequent process. The dummy gate dielectric layer is, for example, a silicon oxide layer.

In some embodiments, the gate electrode 104 is made of polysilicon, a metal material, another suitable conductive material, or a combination thereof. In some embodiments, the gate electrode 104 is a dummy gate electrode layer and will be replaced with another conductive material such as a metal material. The dummy gate electrode layer is made of, for example, polysilicon.

Afterwards, a light ion implantation process is performed to form two lightly doped regions 106a and 106b, as shown in FIG. 1A in accordance with some embodiments. The lightly doped regions 106a and 106b are positioned at each side of the gate stack, respectively. Afterwards, spacer elements 108 are formed on each sidewall of the gate stack, as shown in FIG. 1A in accordance with some embodiments.

In some embodiments, the spacer elements 108 are made of silicon nitride, silicon oxide, silicon oxynitride, silicon carbide, another suitable material, or a combination thereof. The spacer elements 108 are used to assist in a subsequent ion implantation process for forming source and drain regions. In some embodiments, a spacer material layer is deposited over the semiconductor substrate 100 and the gate stack. Afterwards, an etching process is performed to partially remove the spacer material layer and form the spacer elements 108.

As shown in FIG. 1A, doped regions 110a and 110b are formed in the semiconductor substrate 100, in accordance with some embodiments. In some embodiments, an ion implantation process is performed over the semiconductor substrate 100 to form the doped regions 110a and 110b. In some embodiments, a heat operation is performed to activate the dopants in the doped regions 110a and 110b. In some embodiments, the doped region 110a is used as a source region, and the doped region 110b is used as a drain region.

As shown in FIG. 1A, a contact etch stop layer 112 is deposited over the semiconductor substrate 100, the spacer elements 108, and the gate electrode 104, in accordance with some embodiments. The contact etch stop layer 112 is used for controlling the end point during subsequent contact hole formation. In some embodiments, the contact etch stop layer 112 is conformally deposited over the semiconductor substrate 100, the spacer elements 108, and the gate electrode 104.

In some embodiments, the contact etch stop layer 112 is made of silicon nitride, silicon oxynitride, silicon carbide, another suitable material, or a combination thereof. In some embodiments, the contact etch stop layer 112 is deposited by using a CVD process, a physical vapor deposition (PVD) process, a spin-on process, another applicable process, or a combination thereof. Embodiments of the disclosure have many variations. In some other embodiments, the contact etch stop layer 112 is not formed.

As shown in 1A, a dielectric layer 114 is deposited over the contact etch stop layer 112, in accordance with some embodiments. In some embodiments, a planarization process is performed on the dielectric layer 114. As a result, a surface 115 of the dielectric layer 114 is substantially planar. The planarization process may include a chemical mechanical polishing (CMP) process, a grinding process, an etching process, another applicable process, or a combination thereof.

In some embodiments, the dielectric layer 114 is made of silicon oxide or another suitable material. In some embodiments, the dielectric layer 114 is made of a low-k dielectric material. The low-k dielectric material has a dielectric constant smaller than that of silicon oxide. For example, the low-k dielectric material has a dielectric constant in a range from about 1.2 to about 3.5.

As the density of semiconductor devices increases and the size of circuit elements becomes smaller, the resistance capacitance (RC) delay time increasingly dominates circuit performance. Using a low-k dielectric material as the dielectric layer 104 is helpful for reducing the RC delay.

In some embodiments, the dielectric layer 114 includes a spin-on inorganic dielectric, a spin-on organic dielectric, a porous dielectric material, an organic polymer, an organic silica glass, SiOF series material, a hydrogen silsesquioxane (HSQ) series material, a methyl silsesquioxane (MSQ) series material, a porous organic series material, another suitable material, or a combination thereof. In some embodiments, the dielectric layer 114 includes a material including Si, C, O, or H. For example, the dielectric layer 114 includes $SiO_2$, SiOC, SiON, SiCOH, SiOCN, or a combination thereof. In some embodiments, the dielectric layer 114 is made of carbon-doped silicon oxide. The carbon-doped silicon oxide may also be referred to as organosilicate glass (OSG) or C-oxide. In some embodiments, the carbon-doped silicon oxide includes methyl silsesquioxane (MSQ), hydrogen silsesquioxane (HSQ), polysilsesquioxane, another suitable material, or a combination thereof. In some embodiments, the dielectric layer 114 includes fluorine-doped silicate glass (FSG) such as fluorine-doped —$(O-Si(CH_3)_2-O)$—. In some embodiments, the dielectric layer 114 is deposited by using a CVD process, a spin-on process, a spray coating process, another applicable process, or a combination thereof.

Figure 1B:
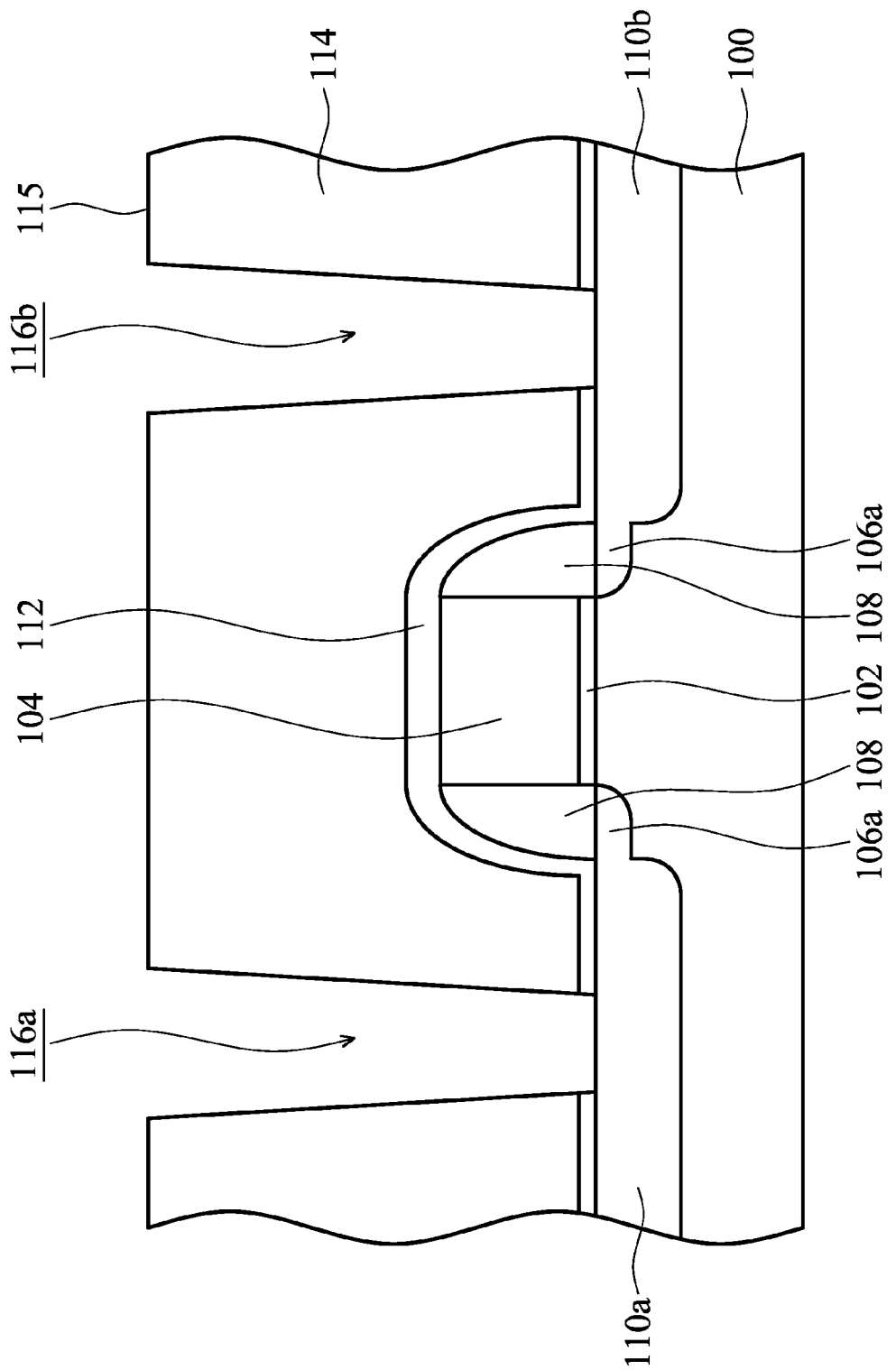

As shown in FIG. 1B, contact holes 116a and 116b are formed in the dielectric layer 114, in accordance with some embodiments. In some embodiments, a photolithography process and an etching process are performed to form holes in the dielectric layer 114 to expose the contact etch stop layer 112. Afterwards, the exposed portions of the contact etch stop layer 112 are removed by using, for example, another etching process. As a result, the contact holes 116a and 116b are formed. The contact holes 116a and 116b extend from the surface 115 of the dielectric layer 114 towards the semiconductor substrate 100. In some embodiments, the contact holes 116a and 116b expose the doped regions 110a and 110b, respectively.

Figure 1C:
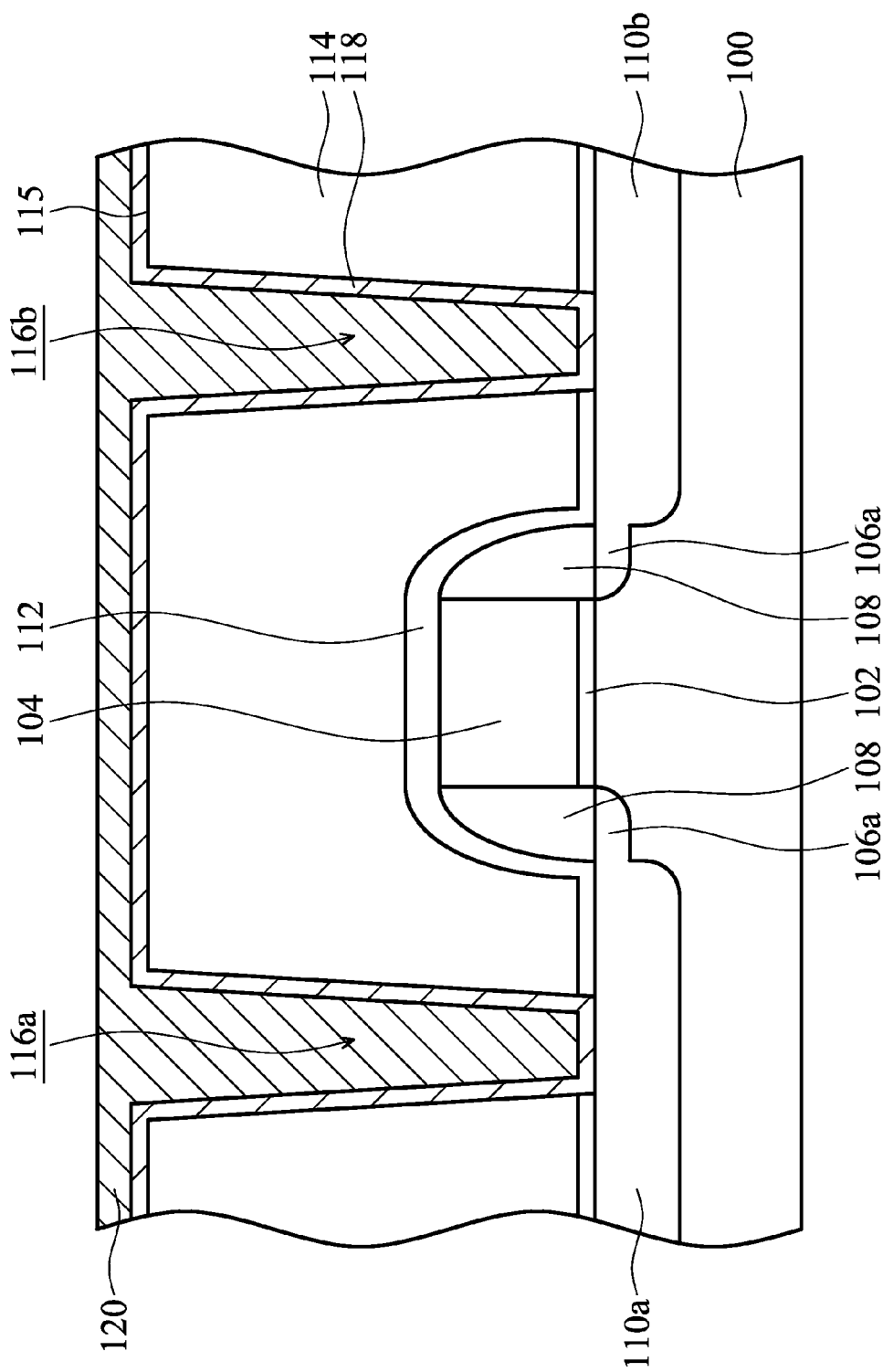

As shown in FIG. 1C, a barrier layer 118 is deposited over the dielectric layer 114 and sidewalls and bottoms of the contact holes 116a and 116h, in accordance with some embodiments. The barrier layer 118 may be used to protect the sidewalls of the contact holes 116a and 116b from being damaged during subsequent processes. The barrier layer 118 may also be used as a glue layer to improve adhesion between the dielectric layer 114 and a subsequently formed conductive material.

In some embodiments, the barrier layer 118 is made of titanium, titanium nitride, tantalum nitride, tungsten nitride, another suitable material, or a combination thereof. In some embodiments, the barrier layer 118 is deposited by using a PVD process, a CVD process, another applicable process, or a combination thereof. Embodiments of the disclosure have many variations. In some other embodiments, the barrier layer 118 is not formed.

Afterwards, a conductive material 120 is deposited to fill the contact holes 116a and 116b, as shown in FIG. 1C in accordance with some embodiments. In some embodiments, the conductive material 120 is made of tungsten. In some other embodiments, the conductive material 120 is made of copper, aluminum, tungsten, titanium, gold, platinum, nickel, another suitable conductive material, or a combination thereof. In some embodiments, the conductive material 120 is deposited by using a CVD process, a PVD process, an electroplating process, an electroless plating process, another applicable process, or a combination thereof.

Figure 1D:
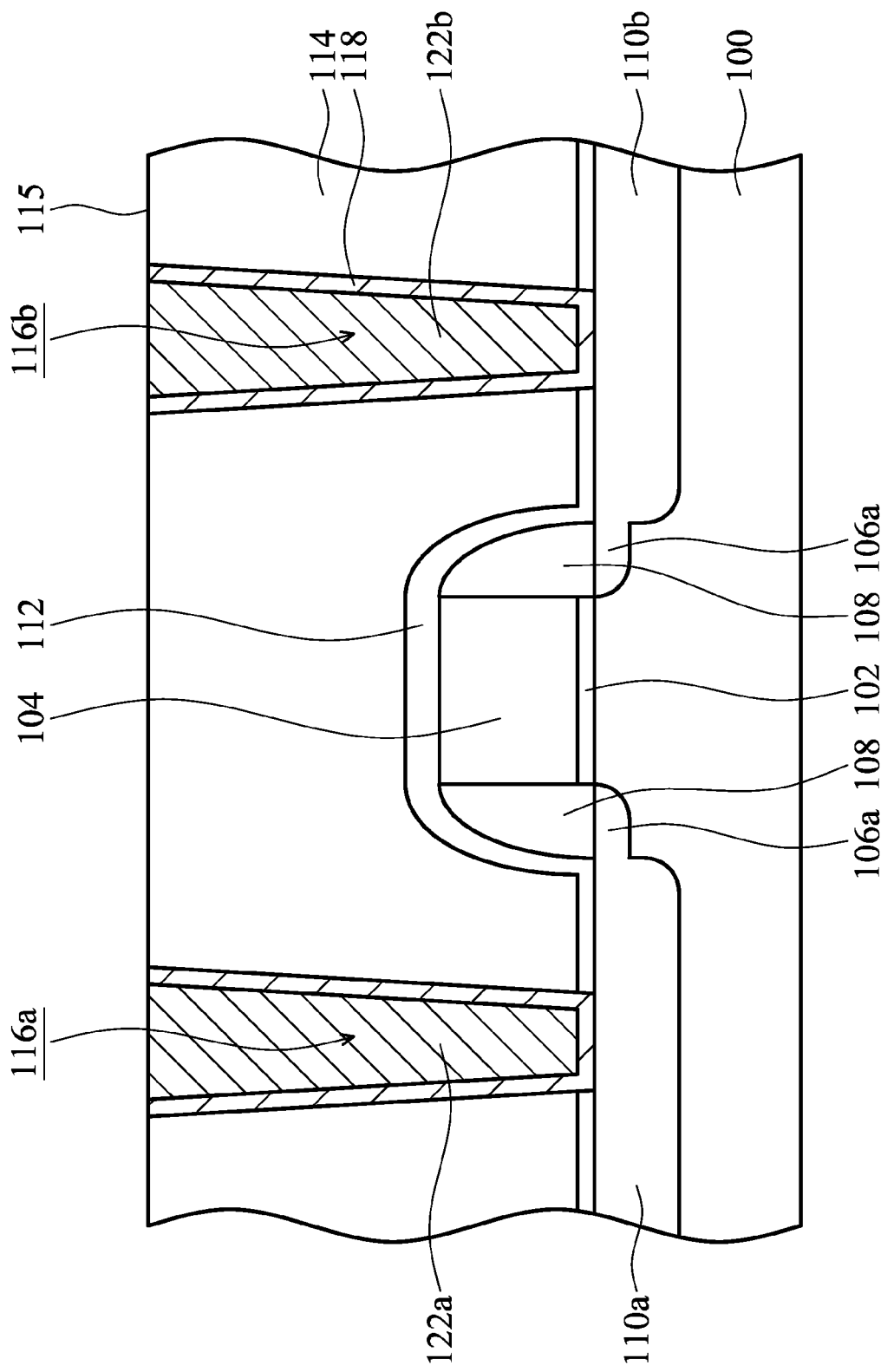

As shown in FIG. 1D, the conductive material 120 and the barrier layer 118 outside of the contact holes 116a and 116b are removed, in accordance with some embodiments. As a result, the conductive material 120 and the barrier layer 118 remaining in the contact holes 116a and 116b form contact plugs 122a and 122b in the dielectric layer 114, as shown in FIG. 1D. The contact plugs 122a and 122b are formed simultaneously. In some other embodiments, each of the contact plugs 112a and 112b further includes a seed layer (not shown).

In some embodiments, the contact plugs 122a and 122b are electrically connected to the doped regions 110a and 110b, respectively. In some embodiments, the contact plug 122a is used to form an electrical connection between the doped region 110a and a bit line (not shown). In some embodiments, the contact plug 122b is used to form an electrical connection between the doped region 110b and a capacitor element which will be formed in the dielectric layer 114.

In some embodiments, an etching back process is used to remove the conductive material 120 and the barrier layer 118 above the surface 115 of the dielectric layer 114. In some other embodiments, a planarization process is used to remove the conductive material 120 and the barrier layer 118 above the surface 115 of the dielectric layer 114. The planarization process may include a CMP process, a grinding process, an etching process, another applicable process, or a combination thereof.

Figure 1E:
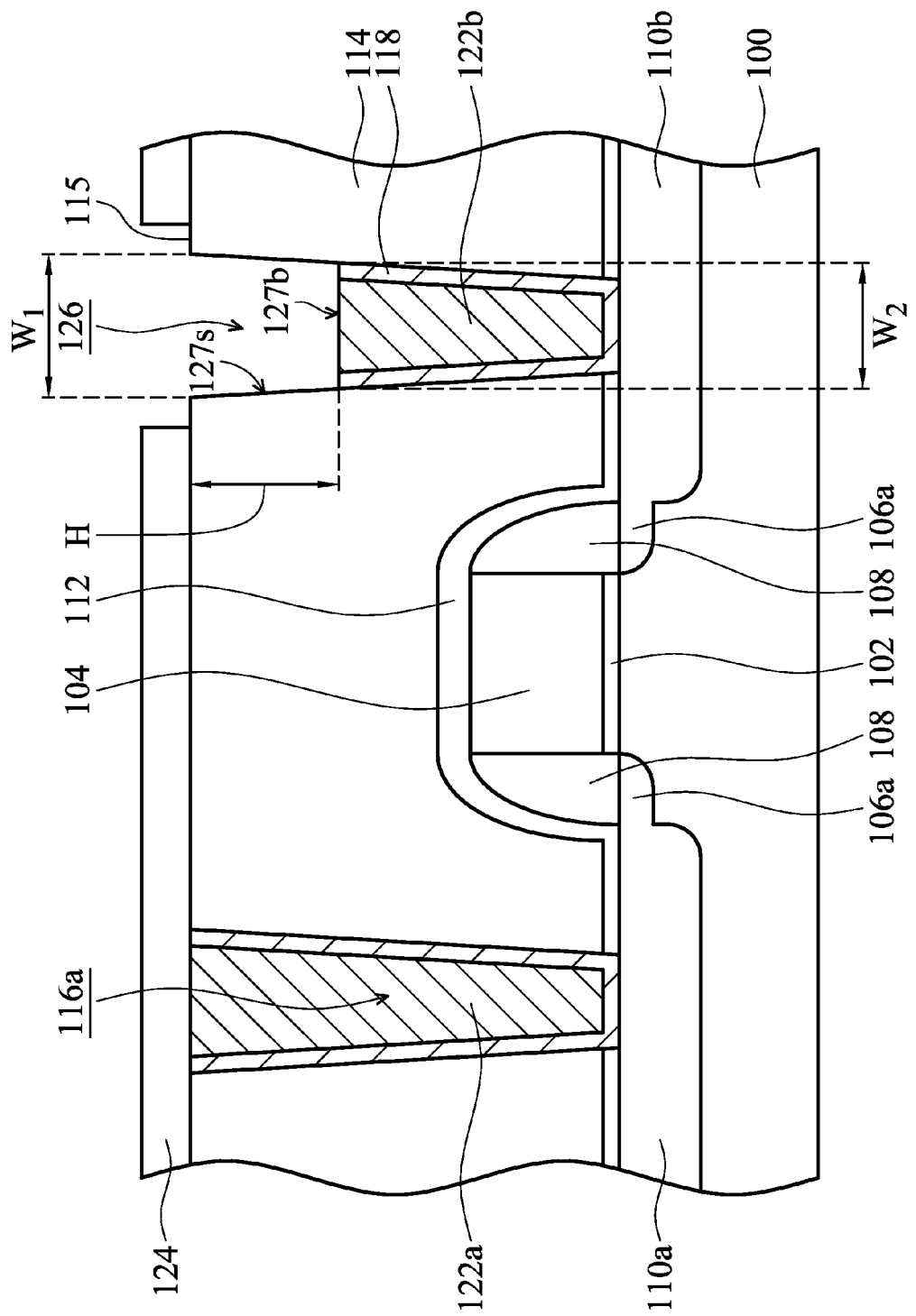

As shown in FIG. 1E, an upper portion of the contact plug 122b is removed to form a recess 126 in the dielectric layer 114, in accordance with some embodiments. The recess 126 has a sidewall 127s and a bottom portion 127b. In some embodiments, the recess 126 extends from the surface 115 of the dielectric layer 114 towards the contact plug 122b. In some embodiments, the recess 126 exposes the contact plug 122b which has been recessed. In some embodiments, an upper portion of the barrier layer 118 is also removed, as shown in FIG. 1E. In some other embodiments, the barrier layer 118 is not completely removed and surrounds the recess 126.

In some embodiments, the recess 126 is used to contain a capacitor element which will be formed therein. As shown in FIG. 1E, the recess 126 has an upper width $W_1$, a lower width $W_2$, and a depth H. In some embodiments, the width $W_1$ is greater than the width $W_2$. The sidewall 127s of the recess 126 inclines to the surface 115 of the dielectric layer 114.

In some embodiments, the width $W_1$ is in a range from about 1 nm to about 1000 nm. In some other embodiments, the width $W_1$ id in a range from about 10 nm to about 500 nm. In some embodiments, the width $W_2$ is in a range from about 1 nm to about 1000 nm. In some other embodiments, the width $W_2$ id in a range from about 10 nm to about 500 nm. The ratio of the width $W_1$ to the width $W_2$ may be in a range from about 0.5 to about 1.5. In some embodiments, the depth H is in a range from about 1 nm to about 100 nm. In some embodiments, the recess 126 has an aspect ratio ($W_1$/H) in a range from about 0.1 to about 10.

Embodiments of the disclosure have many variations. In some other embodiments, the widths $W_1$ and $W_2$ are substantially equal to each other. In some embodiments, the sidewall 127s of the recess 126 is substantially perpendicular to the surface 115 of the dielectric layer 114.

In some embodiments, an etching process is used to partially remove the contact plug 122b so as to form the recess 126. The etching process may include a dry etching process, a wet etching process, or a combination thereof. In some embodiments, a mixture of gases including $SF_6$, nitrogen, and chlorine is used as an etchant gas. However, it should be appreciated that embodiments of the disclosure are not limited thereto. Other suitable etchants may be used depending on the material of the contact plug 122b.

In some embodiments, a mask layer 124 is formed over the dielectric layer 114 and the contact plug 122a, as shown in FIG. 1E. The mask layer 124 has an opening which exposes the contact plug 122b. The mask layer 124 is used to protect the contact plug 122a from being damaged or etched during the formation of the recess 126.

In some embodiments, the mask layer 124 is a patterned photoresist layer. In some embodiments, the opening of the mask layer 124 is designed to be larger than the top surface of the contact plug 122b. Therefore, it is easier to expose the entire top surface of the contact plug 122b. In some embodiments, the mask layer 124 is removed after the recess 126 is formed.

Figure 1F:
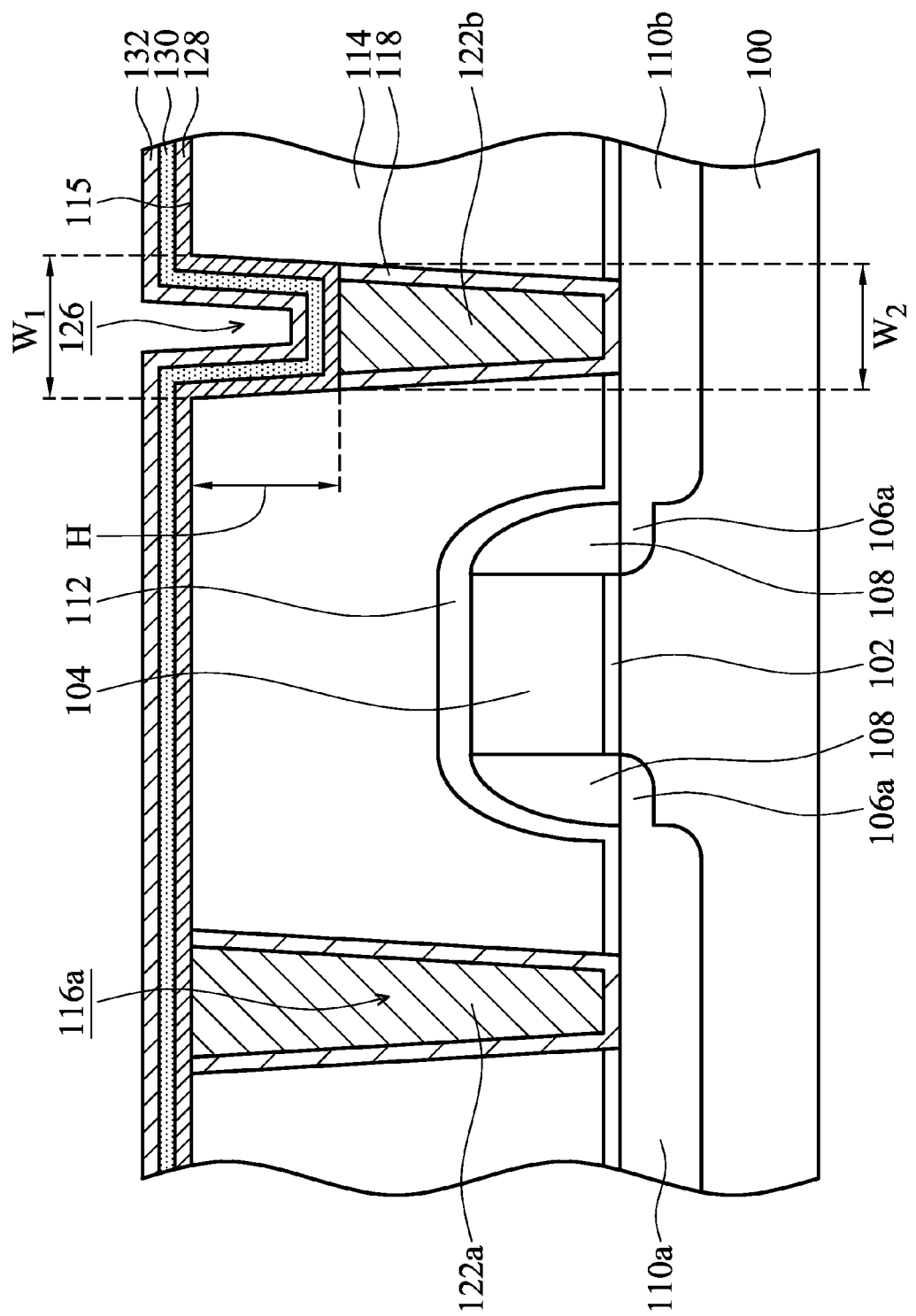

As shown in FIG. 1F, an electrode layer 128 is deposited over the dielectric layer 114 and the sidewall 127s and the bottom portion 127b of the recess 126, in accordance with some embodiments. In some embodiments, the electrode layer 128 is conformally formed over the sidewall 127s and the bottom portion 127b of the recess 126. The electrode layer 128 is electrically connected to the contact plug 122b. In some embodiments, the contact plug 122b forms an electrical connection between the doped region 110b and the electrode layer 128.

In some embodiments, the electrode layer 128 is made of titanium nitride, tantalum nitride, titanium, tantalum, ruthenium, another suitable conductive material, or a combination thereof. In some embodiments, the electrode layer 128 is deposited by using a PVD process (such as a sputtering process), a CVD process, another applicable process, or a combination thereof.

Afterwards, an insulating layer 130 is deposited over the electrode layer 128, as shown in FIG. 1F in accordance with some embodiments. In some embodiments, the insulating layer 130 is conformally formed over the electrode layer 128. The insulating layer 130 is used to electrically isolate the electrode layer 128 from a subsequently formed electrode layer over the insulating layer 130. In some embodiments, the insulating layer 130 is a high-k dielectric material which has a dielectric constant higher than that of silicon oxide.

In some embodiments, the insulating layer 130 is made of zirconium oxide, titanium oxide, hafnium oxide, zirconium silicon oxide, hafnium silicon oxide, tantalum oxide, lanthalum oxide, aluminum oxide, another suitable material, or a combination thereof. In some embodiments, the insulating layer 130 has a crystalline structure. In some embodiments, the insulating layer 130 is deposited by using a PVD process (such as a sputtering process), a CVD process, a spin-on process, a spray coating process, another applicable process, or a combination thereof.

As shown in FIG. 1F, an electrode layer 132 is deposited over the insulating layer 130, in accordance with some embodiments. In some embodiments, the electrode layer 132 is conformally formed over the insulating layer 130. The insulating layer 130 electrically isolates the electrode layer 132 from the electrode layer 128.

In some embodiments, the electrode layer 132 is made of titanium nitride, tantalum nitride, titanium, tantalum, ruthenium, another suitable conductive material, or a combination thereof. In some embodiments, the materials of the electrode layers 128 and 130 are substantially the same. In some embodiments, the electrode layer 132 is deposited by using a PVD process (such as a sputtering process), a CVD process, another applicable process, or a combination thereof.

Figure 1G:
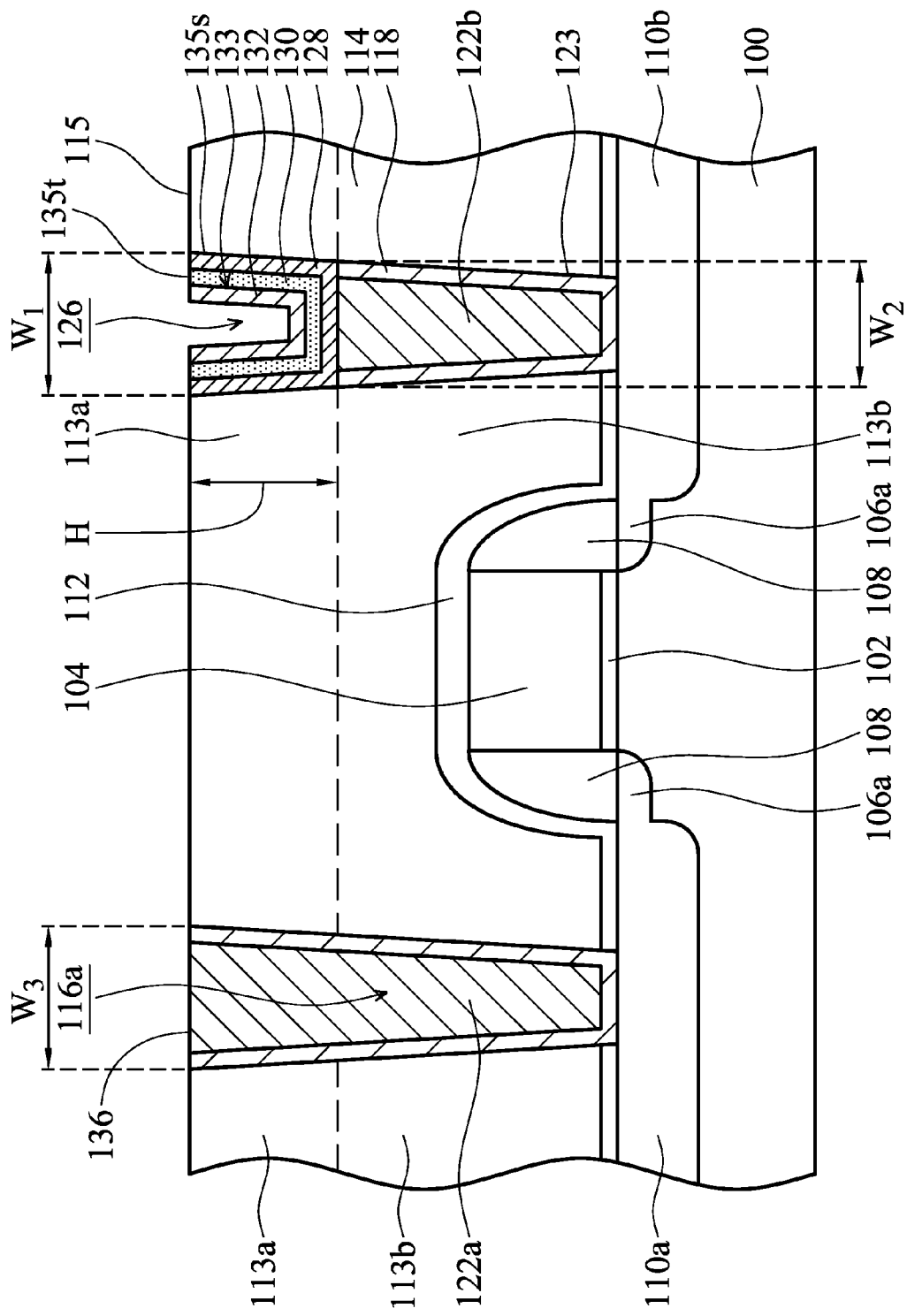

As shown in FIG. 1G, excess portions of the electrode layer 128, the insulating layer 130, and the electrode layer 132 outside of the recess 126 are removed, in accordance with some embodiments. The electrode layer 128, the insulating layer 130, and the electrode layer 132 remaining in the recess 126 together form a capacitor element 133 with a metal-insulator-metal (MIM) structure. The electrode layer 128 and the electrode layer 132 serve as a lower electrode plate and an upper electrode plate of the capacitor element 133, respectively. The insulating layer 133 is used in conjunction with the electrode layers 128 and 132 to store charges.

In some embodiments, a planarization process is performed to remove the excess portions outside of the recess 126. The planarization process may include a CMP process, a grinding process, an etching process, another applicable process, or a combination thereof. In some embodiments, the capacitor element 133 is completely located in the recess 126 after the planarization process.

As shown in FIG. 1G, the capacitor element 133 has a sidewall surface 135s, and the contact plug 122b has a sidewall surface 123. In some embodiments, the sidewall surface 135s of the capacitor element 133 is substantially coplanar with the sidewall surface 123 of the contact plug 122b, as shown in FIG. 1G. In some embodiments, the sidewall surface 135s of the capacitor element 133 inclines to the surface 115 of the dielectric layer 114. In some other embodiments, the sidewall surface 135s of the capacitor element 133 is substantially perpendicular to the surface 115 of the dielectric layer 114. As shown in FIG. 1G, the capacitor element 133 has a top surface 135t. In some embodiments, the top surface 135t of the capacitor element 133 is substantially coplanar with the surface 115 of the dielectric layer 114.

As shown in FIG. 1G, the contact plug 122a has a top surface 136. In some embodiments, the top surface 136 of the contact plug 122a is substantially coplanar with the top surface 135t of the capacitor element 133. In some embodiments, the capacitor element 133 is not positioned higher than the contact plug 122a. As shown in FIG. 1G, the contact plug 122a has a width $W_3$. In some embodiments, the width $W_3$ is substantially equal to the width $W_1$. In some embodiments, the capacitor element 133 is not wider than the contact plug 122b. In some embodiments, the capacitor element is not wider than the contact plug 122a.

As shown in FIG. 1G, the dielectric layer 114 has an upper portion 113a and a lower portion 113b. The upper portion 113a surrounds the capacitor element 133, and the lower portion 113b surrounds the contact plug 122b. In some embodiments, the upper portion 113a and the lower portion 113b are a single layer (or a single piece). In some embodiments, there is no etch stop layer formed between the upper portion 113a and the lower portion 113b.

Figure 1H:
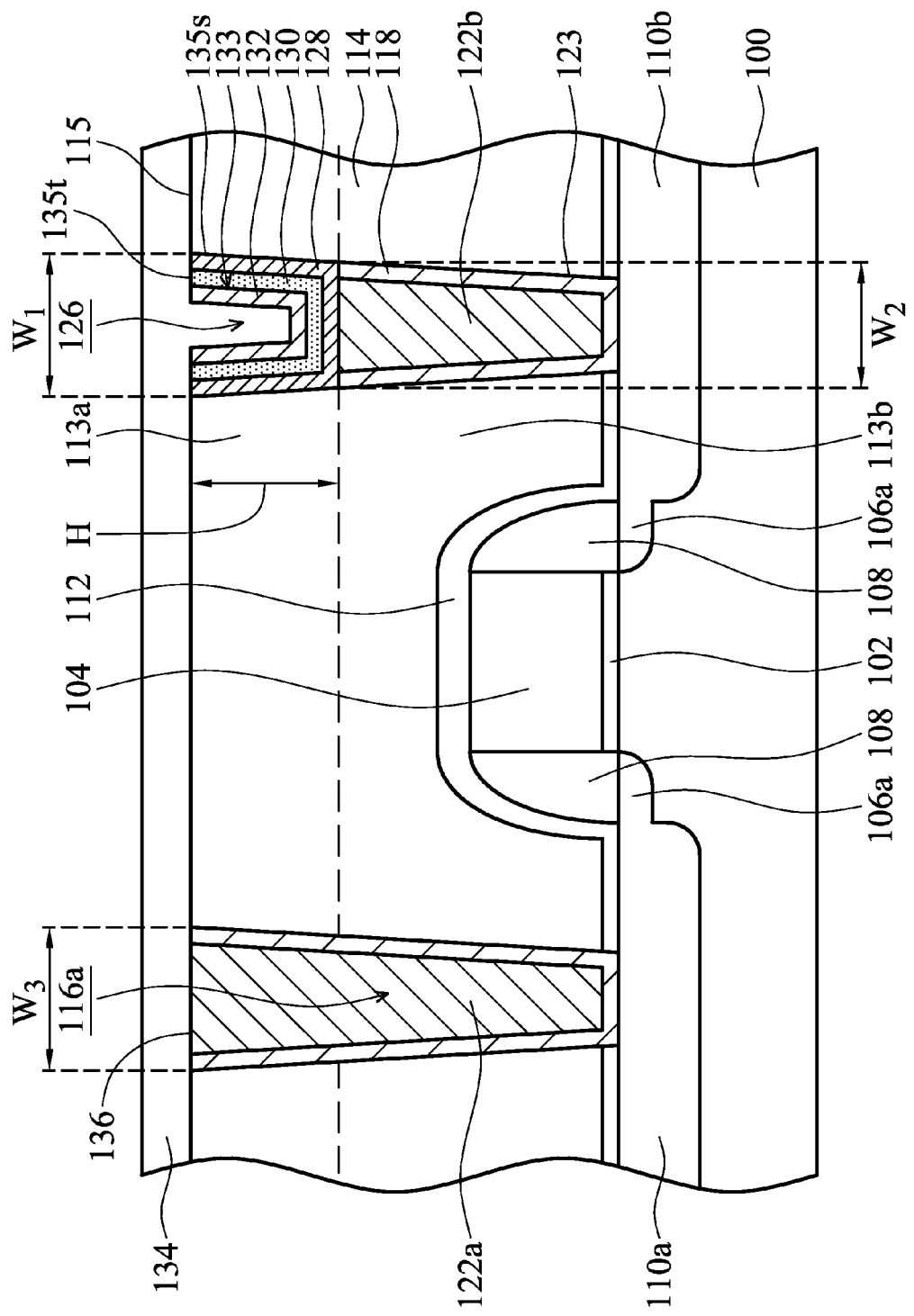

Afterwards, a dielectric layer 134 is deposited over the dielectric layer 114, the contact plug 122a, and the capacitor element 133, as shown in FIG. 1H in accordance with some embodiments. In some embodiments, the dielectric layer 134 fills the recess 126. In some embodiments, the material and the formation method of the dielectric layer 134 are similar to those of the dielectric layer 114. Other interconnect structures (not shown) may be formed in the dielectric layer 134 in subsequent processes.

FIGS. 2A-2D are top views of the capacitor element 133 shown in FIG. 1G, in accordance with some embodiments. The exterior profile of the capacitor element 133 depends on the exterior profile of the recess 126 shown in FIG. 1E, which further depends on the exterior profile of the contact hole 116b. By tuning the profile of the contact hole 116b or the recess 126, the profile of the capacitor element 133 may also be varied according to requirement.

Figure 2A:
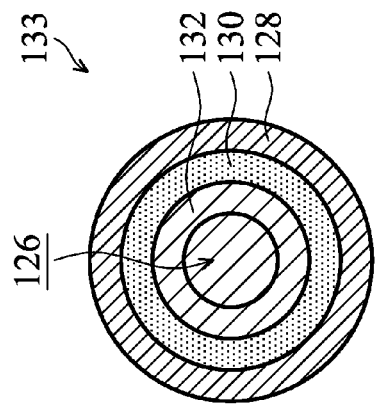
FIGS. 2A-2D are top views each shows a semiconductor device, in accordance with some embodiments.
Figure 2B:
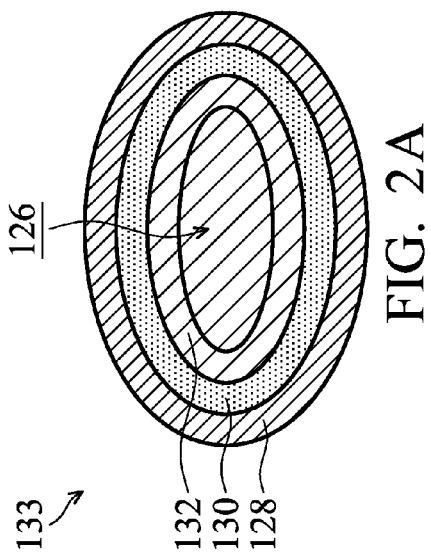
Figure 2C:
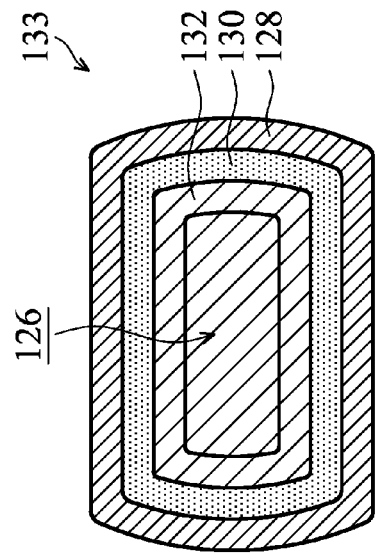
Figure 2D:
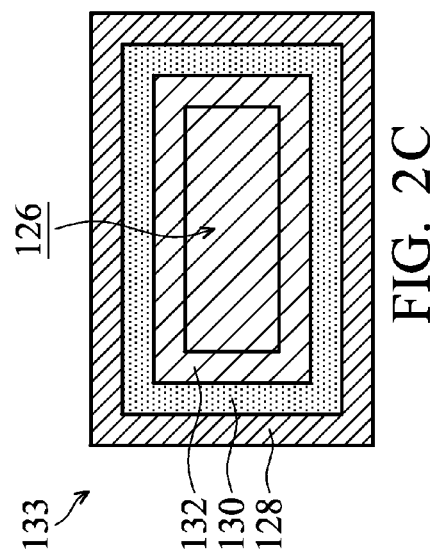

As shown in FIG. 2A, the capacitor element 133 has a substantially oval top-view shape, in accordance with some embodiments. Embodiments of the disclosure have many variations. In some other embodiments, the capacitor element 133 has a substantially circular top-view shape, as shown in FIG. 2B. As shown in FIG. 2C, the capacitor element 133 has a substantially rectangular top-view shape, in accordance with some embodiments. As shown in FIG. 2D, the capacitor element 133 has a substantially rectangular top-view shape, and has curved sides. The capacitor element 133 may have another suitable top-view shape, such as a substantially square shape.

Figure 3:
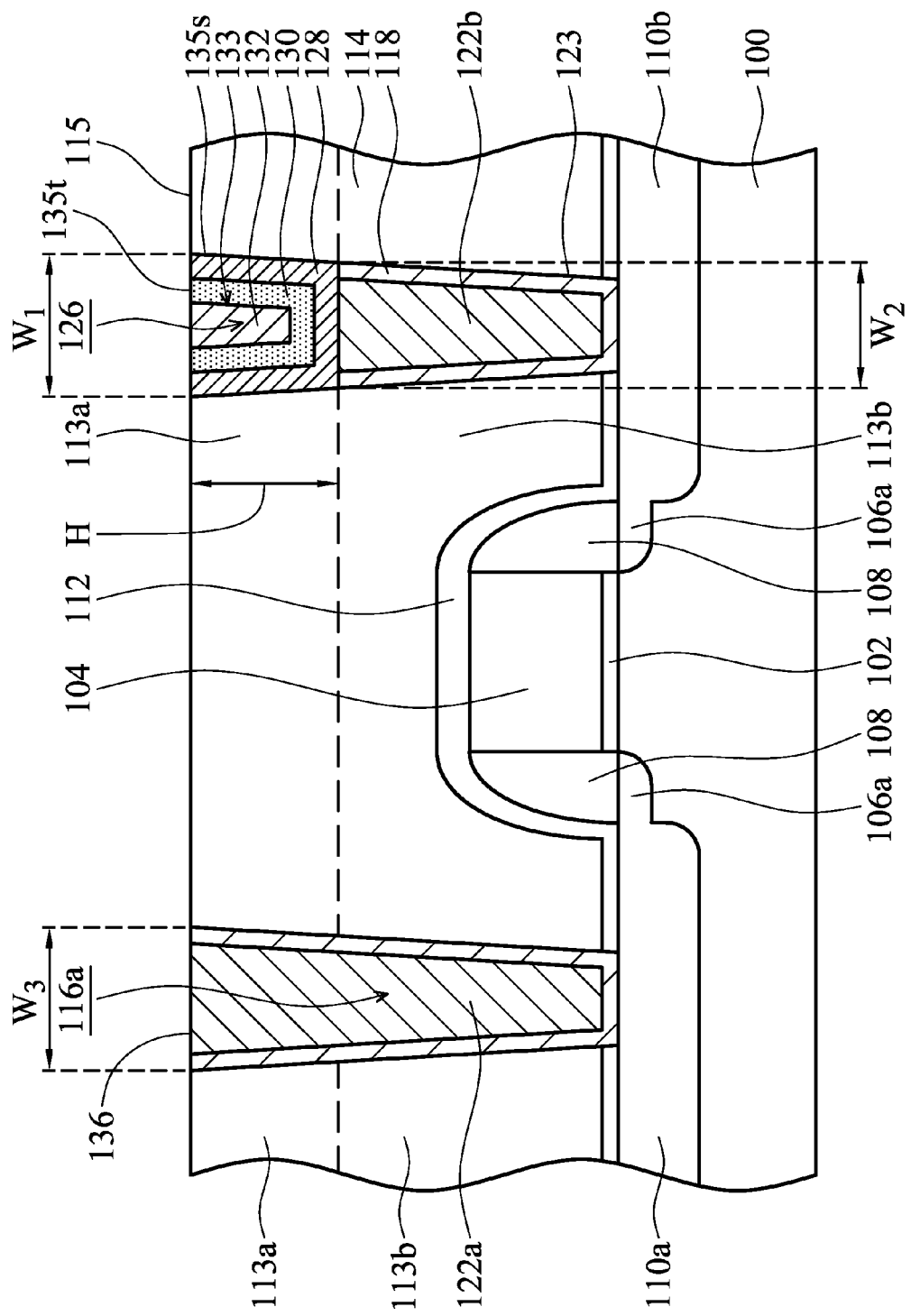
FIG. 3 is a cross-sectional view of a semiconductor device, in accordance with some embodiments.

In some embodiments, the capacitor element 133 occupies a portion of the recess 126, as shown in FIG. 1G. Embodiments of the disclosure have many variations and are not limited thereto. FIG. 3 is a cross-sectional view of a semiconductor device, in accordance with some embodiments.

In some embodiments, the recess 126 is relatively small and/or the electrode layer 128 and the insulating layer 130 are relatively thick. In these cases, the electrode layer 132 may not be conformally formed over the insulating layer 130. In some embodiments, the electrode layer 132 fills the recess 126 completely, as shown in FIG. 3.

Embodiments of the disclosure form a capacitor element in a recess formed by recessing a contact plug. It may not be needed to perform complex formation processes for forming a capacitor element with a crown structure. The fabrication cost and fabrication time are therefore significantly reduced. The size of the semiconductor device is also reduced. Reliability and performance of the semiconductor device are improved.

In accordance with some embodiments, a semiconductor device is provided. The semiconductor device includes a semiconductor substrate and a dielectric layer over the semiconductor substrate. The semiconductor device also includes a contact plug in the dielectric layer, and a recess extending from a surface of the dielectric layer towards the contact plug. The semiconductor device further includes a capacitor element in the recess and electrically connected to the contact plug.

In accordance with some embodiments, a semiconductor device is provided. The semiconductor device includes a semiconductor substrate and a dielectric layer over the semiconductor substrate. The semiconductor device also includes a contact plug in the dielectric layer. The semiconductor device further includes a capacitor element in the dielectric layer and over the contact plug. A sidewall surface of the capacitor element is substantially coplanar with a sidewall surface of the contact plug.

In accordance with some embodiments, a method for forming a semiconductor device is provided. The method includes forming a dielectric layer over a semiconductor substrate and forming a contact plug in the dielectric layer. The method also includes partially removing the contact plug to form a recess over the contact plug. The method further includes forming a capacitor element in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a dielectric layer over the semiconductor substrate;
   a contact plug in the dielectric layer;
   a recess extending from a surface of the dielectric layer towards the contact plug; and
   a capacitor element in the recess and electrically connected to the contact plug, wherein a bottom of the capacitor element is substantially as large as a top of the contact plug, and a top surface of the capacitor element is substantially coplanar with the surface of the dielectric layer.

2. The semiconductor device as claimed in claim 1, wherein the capacitor element comprises:
   a first electrode layer over a sidewall and a bottom portion of the recess;
   an insulating layer over the first electrode layer; and
   a second electrode layer over the insulating layer.

3. The semiconductor device as claimed in claim 2, wherein:
   the first electrode layer is conformally formed over the sidewall and the bottom portion of the recess,
   the insulating layer is conformally formed over the first electrode layer, and
   the second electrode layer is conformally formed over the insulating layer.

4. The semiconductor device as claimed in claim 2, wherein top surfaces of the first electrode layer, the insulating layer, and the second electrode layer are coplanar with each other.

5. The semiconductor device as claimed in claim 1, wherein the capacitor element has a first sidewall surface extending from a top of the capacitor element to a bottom of the capacitor element, the contact plug has a second sidewall surface extending from a top of the contact plug towards a bottom of the contact plug, and the first sidewall surface of the capacitor element is substantially coplanar with the second sidewall surface of the contact plug.

6. The semiconductor device as claimed in claim 1, wherein the contact plug is electrically connected to a drain region of a transistor.

7. The semiconductor device as claimed in claim 6, further comprising a second contact plug in the dielectric layer, wherein the second contact plug is electrically connected to a source region of the transistor.

8. The semiconductor device as claimed in claim 7, wherein a top surface of the second contact plug is substantially coplanar with the top surface of the capacitor element.

9. The semiconductor device as claimed in claim 1, wherein the capacitor element is completely in the recess.

10. The semiconductor device as claimed in claim 1, wherein shapes of a bottom of the capacitor element and a top of the contact plug are substantially the same.

11. The semiconductor device as claimed in claim 1, wherein the dielectric layer is a single layer having an upper portion and a lower portion, the upper portion surrounds the capacitor element, and the lower portion surrounds the contact plug.

12. A semiconductor device, comprising:
    a semiconductor substrate;
    a dielectric layer over the semiconductor substrate;
    a contact plug in the dielectric layer; and
    a capacitor element in the dielectric layer and over the contact plug, wherein a sidewall surface of the capacitor element extending from a bottom surface of the capacitor element and ending at a top surface of the capacitor element is substantially coplanar with a sidewall surface of the contact plug.

13. The semiconductor device as claimed in claim 12, wherein the top surface of the capacitor element is substantially coplanar with a surface of the dielectric layer.

14. The semiconductor device as claimed in claim 12, further comprising a second contact plug in the dielectric layer, wherein a top surface of the second contact plug is substantially coplanar with the top surface of the capacitor element.

15. The semiconductor device as claimed in claim 12, wherein the capacitor element comprises:
    a first electrode layer over the contact plug, wherein the first electrode layer has a surface substantially coplanar with the sidewall surface of the contact plug;
    an insulating layer over the first electrode layer; and
    a second electrode layer over the insulating layer, wherein a bottom of the capacitor element is substantially as large as a top of the contact plug.

16. The semiconductor device as claimed in claim 12, wherein the sidewall surface of the capacitor element and the sidewall surface of the contact plug are slanted sidewall surfaces with respect to a main surface of the dielectric layer.

17. A semiconductor device, comprising:
    a semiconductor substrate;
    a dielectric layer over the semiconductor substrate;
    a contact plug in the dielectric layer;
    a recess extending from a surface of the dielectric layer towards the contact plug and aligned with the contact plug; and
    a capacitor element in the recess, wherein a sidewall surface of the capacitor element extending from a bottom surface of the capacitor element and ending at a top surface of the capacitor element is substantially coplanar with a sidewall surface of the contact plug, and shapes of a bottom of the capacitor element and a top of the contact plug are substantially the same.

18. The semiconductor device as claimed in claim 17, wherein the top surface of the capacitor element is substantially coplanar with the surface of the dielectric layer.

19. The semiconductor device as claimed in claim 17, wherein the capacitor element completely fills the recess.

20. The semiconductor device as claimed in claim 17, wherein the capacitor element has a first electrode layer, an insulating layer, and a second electrode layer, and top surfaces of the first electrode layer, the insulating layer, and the second electrode layer are coplanar with each other.

* * * * *